United States Patent
Karasawa et al.

(10) Patent No.: US 6,664,603 B2
(45) Date of Patent: Dec. 16, 2003

(54) SEMICONDUCTOR DEVICE, MEMORY SYSTEM AND ELECTRONIC APPARATUS

(75) Inventors: Junichi Karasawa, Tatsuno-machi (JP); Kunio Watanabe, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/153,430

(22) Filed: May 21, 2002

(65) Prior Publication Data

US 2002/0190330 A1 Dec. 19, 2002

(30) Foreign Application Priority Data

May 24, 2001 (JP) ........................................ 2001-155114

(51) Int. Cl.[7] .............................................. H01L 29/76
(52) U.S. Cl. ........................................ 257/393; 257/903
(58) Field of Search .................................. 257/393, 903

(56) References Cited

U.S. PATENT DOCUMENTS 6,160,298 A * 12/2000 Ohkubo ...................... 257/393
6,501,138 B1 * 12/2002 Karasawa .................... 257/371

FOREIGN PATENT DOCUMENTS

| JP | 11-135647 | 5/1999 |
|---|---|---|
| JP | 2000-217076 | 8/2000 |
| JP | 2000-269319 | 9/2000 |

OTHER PUBLICATIONS

Asanga H. Perera, et al., "A Versatile 0.13 $\mu$m CMOS Platform Technology Supporting High Performance and Low Power Applications", Motorola Digital DNA Laboratories and AMD, IEDM 2000, section 23.4.1–23.4.4.

Y. Takao, et al., "A 0.11 $\mu$m CMOS Technology with Copper and Very–low–k Interconnects for High–Performance System–On–a Chip Cores", Manufacturing Technology Division, Fujitsu Limited, IEDM 2000, sections 23.1.1–23.1.4.

* cited by examiner

Primary Examiner—David Nelms
Assistant Examiner—Andy Huynh
(74) Attorney, Agent, or Firm—Hogan & Hartson, LLP

(57) ABSTRACT

A semiconductor device having a memory cell including first and second load transistors, first and second driver transistors, and first and second transfer transistors. The semiconductor device includes a first gate-gate electrode layer and a first drain-gate wiring layer. A distance L1 between the edges of the first drain-gate wiring layer and an active region of the first driver transistor is greater than or equal to a distance L2 between the first drain-gate wiring layer and an active region of the first load transistor. This structure provides semiconductor devices in which memory cells having desired characteristics can be readily fabricated. The invention also provides memory systems and electronic apparatuses which include the above semiconductor devices.

15 Claims, 17 Drawing Sheets

Field-First Conductive Layer

SEMICONDUCTOR DEVICE, MEMORY SYSTEM AND ELECTRONIC APPARATUS

BACKGROUND OF THE INVENTION

1. Field of the Invention

The present invention relates to semiconductor devices such as SRAMs (static random access memories), and memory systems and electronic apparatuses equipped with the same.

2. Description of the Related Art

SRAMs are a type of semiconductor memory devices that do not require a refreshing operation and therefore have properties that can simplify the system and lower power consumption. For this reason, SRAMs are widely used as memories for electronic equipment such as mobile phones.

SUMMARY OF THE INVENTION

The present invention provides semiconductor devices in which memory cells having desired characteristics can be readily fabricated and which has an improved operation margin for memory cells. The present invention also provides memory systems and electronic apparatuses that include such semiconductor devices.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve the advantages and in accordance with the purpose of the present invention, as embodied and broadly described, the present invention provides a semiconductor device having a memory cell including a first load transistor, a second load transistor, a first driver transistor, a second driver transistor, a first transfer transistor, and a second transfer transistor. The semiconductor device includes a first gate-gate electrode layer including a gate electrode of the first load transistor and a gate electrode of the first driver transistor; and a first drain-gate wiring layer that is continuous with the first gate-gate electrode layer, provided in a manner to extend in a direction transverse to the first gate-gate electrode layer, and provided at least between an active region for the first load transistor and an active region for the first driver transistor. A distance L1 between the edges of the first drain-gate wiring layer and the active region for the first driver transistor is greater than or equal to a distance L2 between the edges of the first drain-gate wiring layer and the active region for the first load transistor.

This structure enables the first driver transistor to be readily fabricated without changing the gate width of the first driver transistor. Accordingly, a first driver transistor having desired characteristics can be readily fabricated, as well as memory cells having desired characteristics.

The present invention also provides for a semiconductor device having a memory cell including a first load transistor, a second load transistor, a first driver transistor, a second driver transistor, a first transfer transistor, and a second transfer transistor. The semiconductor device includes a first gate-gate electrode layer including a gate electrode of the first load transistor and a gate electrode of the first driver transistor; a second gate-gate electrode layer including a gate electrode of the second load transistor and a gate electrode of the second driver transistor; a first drain-gate wiring layer that is continuous with the first gate-gate electrode layer, provided in a manner to extend in a direction transverse to the first gate-gate electrode layer, and provided at least between an active region for the first load transistor and an active region for the first driver transistor; and a contact pad layer that is continuous with the second gate-gate electrode layer, provided in a manner to extend in a direction transverse to the second gate-gate electrode layer, and provided between an active region for the second load transistor and an active region for the second driver transistor. A distance L1 between the edges of the first drain-gate wiring layer and the active region for the first driver transistor is substantially equal to a distance L3 between the edges of the contact pad layer and the active region for the second driver transistor.

By using this structure, a change in the gate length of the first driver transistor and a change in the gate length of the second driver transistor can be made equal to each other even when alignment errors occur in the process. Accordingly, occurrence of a difference in the capability between the first driver transistor and the second driver transistor is reduced. As a result, the operation margin of memory cells can be improved.

In another aspect, the present invention provides a memory system including the above semiconductor device.

In yet another aspect, the present invention provides an electronic apparatus including the above semiconductor device.

It is to be understood that both the foregoing general description and the following detailed description are exemplary and explanatory and are intended to provide further explanation of the invention as claimed.

DETAILED DESCRIPTION OF THE PREFERRED EMBODIMENTS

An embodiment of the present invention is described. The present embodiment is the one in which a semiconductor device in accordance with the present invention is applied to an SRAM.

[1] Equivalent Circuit of an SRAM

Figure 1:
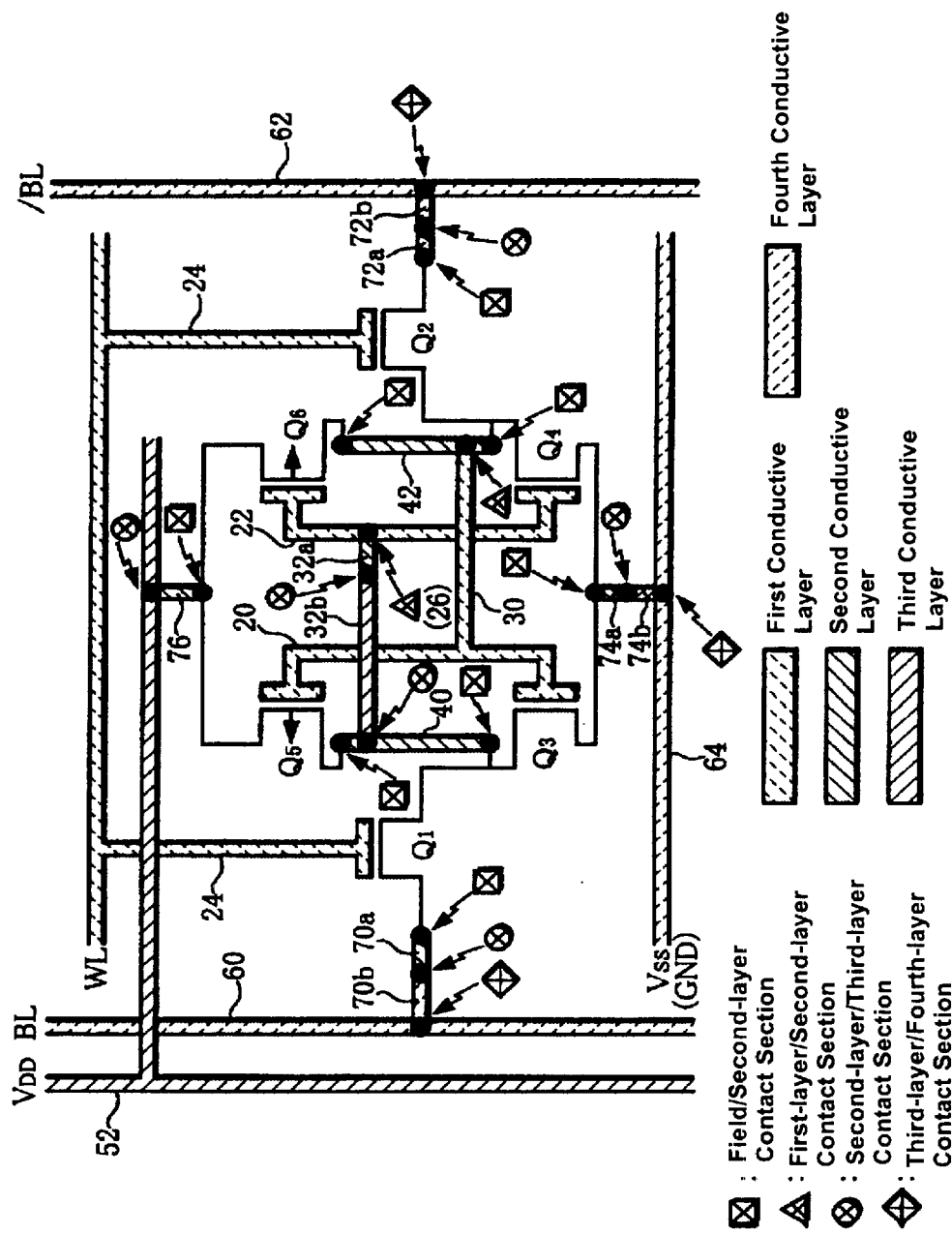
FIG. 1 shows an equivalent circuit of an SRAM in accordance with an embodiment of the present invention.

FIG. 1 shows an equivalent circuit of an SRAM in accordance with the present embodiment. The SRAM of the present embodiment is a type in which one memory cell is formed with six MOS field effect transistors. One CMOS inverter is formed by an n-channel type driver transistor Q3 and a p-channel type load transistor Q5. Another CMOS inverter is formed by an n-channel type driver transistor Q4 and a p-channel type load transistor Q6. These two CMOS inverters are cross-coupled to form a flip-flop as shown. One memory cell is formed from this flip-flop and n-channel type transfer transistors Q1 and Q2.

[2] Structure of the SRAM

A structure of the SRAM is described below. The SRAM is formed including an element forming region formed in a field, a first conductive layer, a second conductive layer, a third conductive layer, and a fourth conductive layer. The structure of each of the field, and the first through fourth conductive layers is described below.

(1) Field

Figure 2:
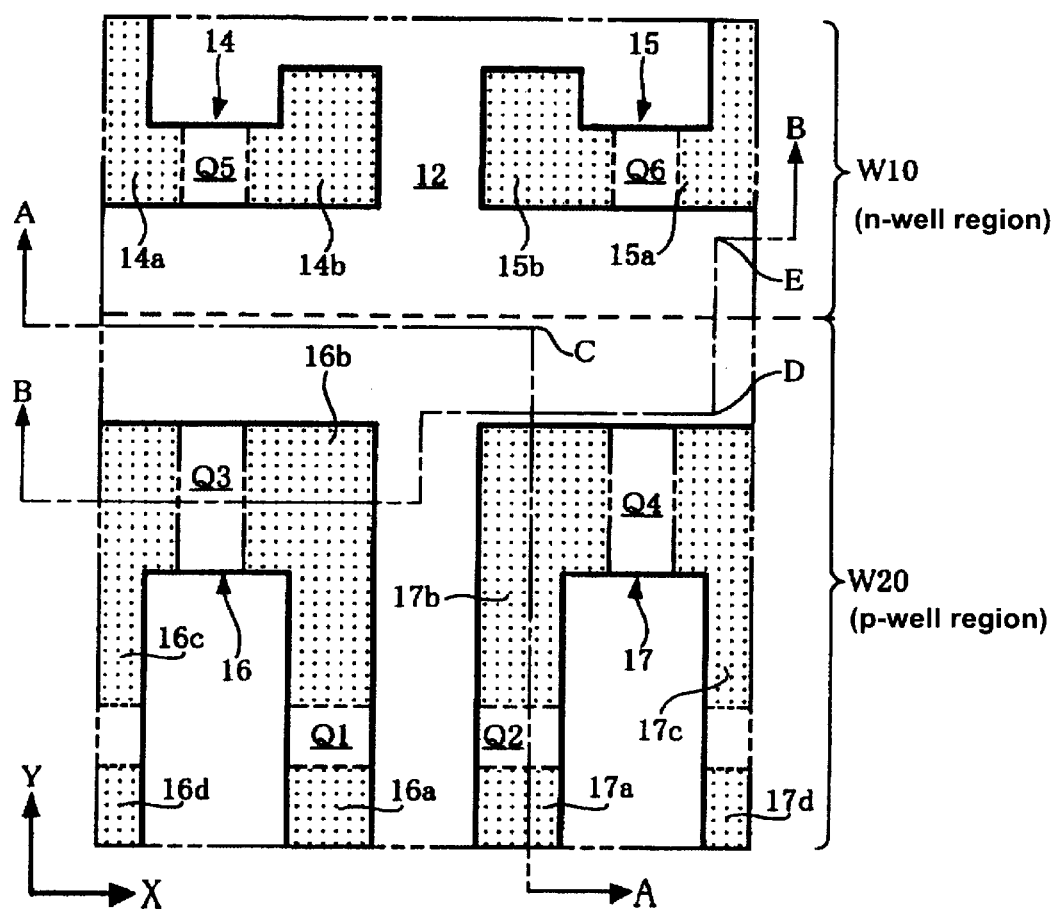
FIG. 2 schematically shows a plan view of a field of the memory cell of the SRAM in accordance with the present embodiment.

Referring to FIG. 2, the field is described. The field includes first through fourth active regions 14, 15, 16 and 17, and an element isolation region 12. The first through fourth active regions 14, 15, 16 and 17 are defined by the element isolation region 12. A region on the side where the first and second active regions 14 and 15 are formed is an n-type well region W10, and a region on the side where the third and fourth active regions 16 and 17 are formed is a p-type well region W20. The first active region 14 and the second active region 15 are disposed in a symmetrical relation in their plane configuration, and the third active region 16 and the fourth active region 17 are disposed in a symmetrical relation in their plane configuration.

The first load transistor Q5 is formed in the first active region 14. In the first active region 14, a first p$^+$-type impurity layer 14a and a second p$^+$-type impurity layer 14b are formed. The first p$^+$-type impurity layer 14a functions as a source of the first load transistor Q5. The second p$^+$-type impurity layer 14b functions as a drain of the first load transistor Q5. The second load transistor Q6 is formed in the second active region 15. In the second active region 15, a third p$^+$-type impurity layer 15a and a fourth p$^+$-type impurity layer 15b are formed. The third p$^+$-type impurity layer 15a functions as a source of the second load transistor Q6. The fourth p$^+$-type impurity layer 15b functions as a drain of the second load transistor Q6.

The first driver transistor Q3 and the first transfer transistor Q1 are formed in the third active region 16. In the third active region 16, first through third n$^+$-type impurity layers 16a, 16b and 16c that are to become components of the transistors Q1 and Q3, and a fifth p$^+$-type impurity layer 16d that constitutes a well contact region are formed. The first n$^+$-type impurity layer 16a functions as a source or a drain of the first transfer transistor Q1. The second n$^+$-type impurity layer 16b functions as a drain of the first driver transistor Q3, and a drain or a source of the first transfer transistor Q1. The third n$^+$-type impurity layer 16c functions as a source of the first driver transistor Q3.

The second driver transistor Q4 and the second transfer transistor Q2 are formed in the fourth active region 17. In the fourth active region 17, fourth through sixth n$^+$-type impurity layers 17a, 17b and 17c that are to become components of the transistors Q2 and Q4, and a sixth p$^+$-type impurity layer 17d that constitutes a well contact region are formed. The fourth n$^+$-type impurity layer 17a functions as a source or a drain of the second transfer transistor Q2. The fifth n$^+$-type impurity layer 17b functions as a drain of the second driver transistor Q4, and a drain or a source of the second transfer transistor Q2. The sixth n$^+$-type impurity layer 17c functions as a source of the second driver transistor Q4.

(2) First Conductive Layer

Figure 3:
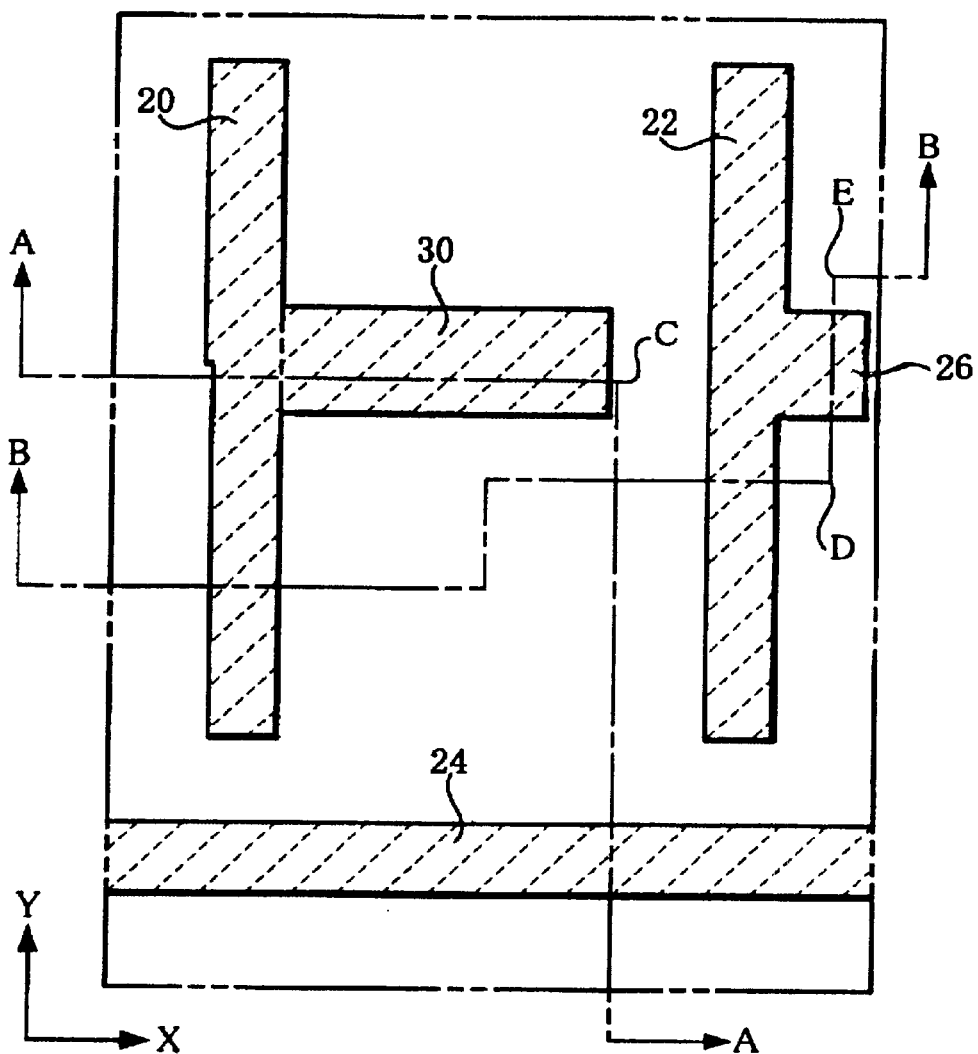
FIG. 3 schematically shows a plan view of a first conductive layer of the memory cell of the SRAM in accordance with the present embodiment.
Figure 7:
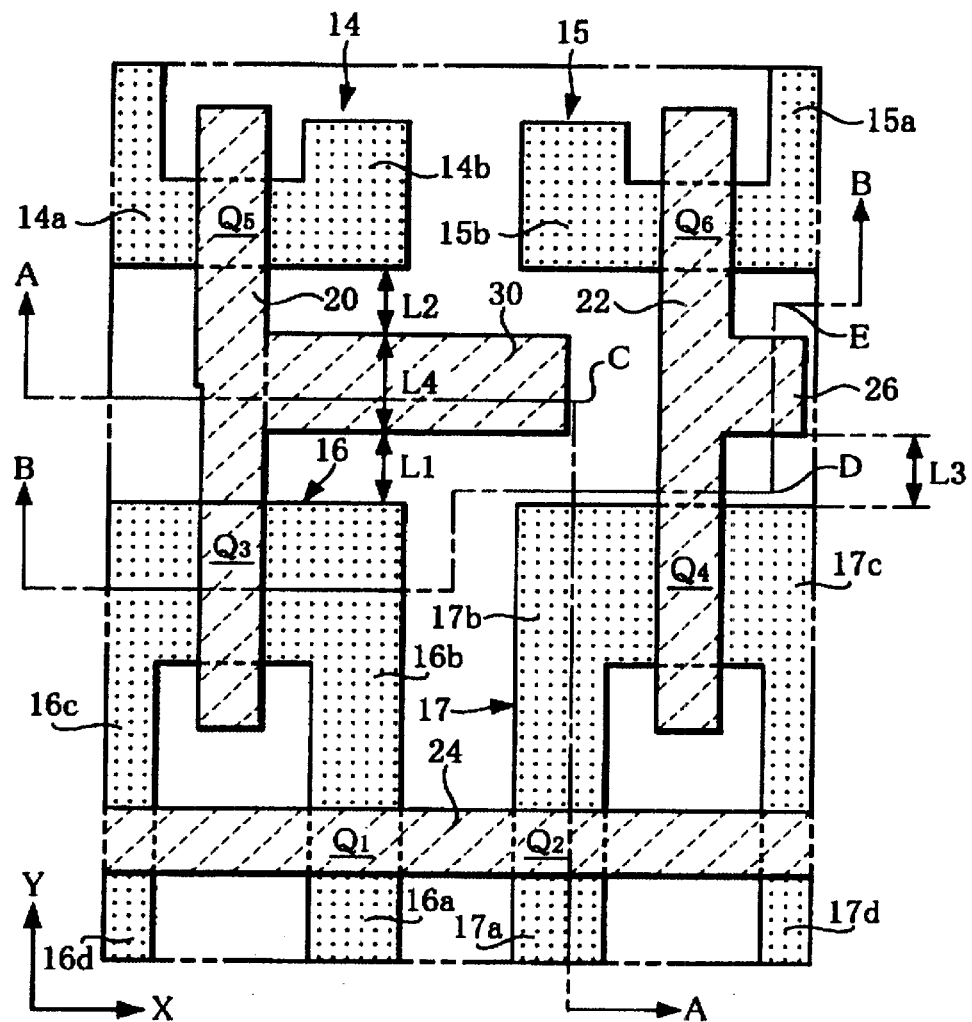
FIG. 7 schematically shows a plan view of the field and the first conductive layer of the memory cell of the SRAM in accordance with the present embodiment.

Next, referring to FIG. 3 and FIG. 7, the first conductive layer is described. The first conductive layer is formed on the semiconductor substrate.

The first conductive layer includes a first gate-gate electrode layer 20, a second gate-gate electrode layer 22, a first drain-gate wiring layer 30 and an auxiliary word line 24. The first gate-gate electrode layer 20 and the second gate-gate electrode layer 22 are formed in a manner to extend along a Y direction shown in the figures. The first drain-gate wiring layer 30 and the auxiliary word line 24 are formed in a manner to extend along an X direction shown in the figures. Components of the first conductive layer are described below.

1) First Gate-Gate Electrode Layer

The first gate-gate electrode layer 20 is formed transverse to the first active region 14 and the third active region 16, as shown in FIG. 7. The first gate-gate electrode layer 20 functions as a gate electrode of the first load transistor Q5 and the first driver transistor Q3. The first gate-gate electrode layer 20 is formed in a manner to pass between the first p$^+$-type impurity layer 14a and the second p$^+$-type impurity layer 14b, in the first active region 14. Thus, the first gate-gate electrode layer 20, the first p$^+$-type impurity layer 14a and the second p$^+$-type impurity layer 14b form the first load transistor Q5. Similarly, the first gate-gate electrode layer 20 is formed in a manner to pass between the second n$^+$-type impurity layer 16b and the third n$^+$-type impurity layer 16c, in the third active region 16. Thus, the first gate-gate electrode layer 20, the second n$^+$-type impurity layer 16b and the third n$^+$-type impurity layer 16c form the first driver transistor Q3.

2) First Drain-Gate Wiring Layer

The first drain-gate wiring layer 30 is continuous with the first gate-gate electrode layer 20 and formed in a manner to extend in the X direction from a side section of the first gate-gate electrode layer 20 toward the second gate-gate electrode layer 22. Also, as shown in FIG. 7, the first drain-gate wiring layer 30 is formed at least between the first active region 14 and the third active region 16. Further, the first drain-gate wiring layer 30 is formed to meet the following relationship. When a distance between the edges of the first drain-gate wiring layer 30 and the third active region 16 is L1, and a distance between the edges of the first drain-gate wiring layer 30 and the first active region 14 is L2, the first drain-gate wiring layer 30 is provided in such a manner that they meet Expression 1 below.

$$L1 \geq L2 \qquad \text{(Expression 1)}$$

Effects provided when the first drain-gate wiring layer 30 is provided to meet Expression 1 will be described below in section [3] (Effects).

The width L4 of the first drain-gate wiring layer 30 may have a smallest line width among wirings that are formed. Effects obtained when the width L4 of the first drain-gate wiring layer 30 is a smallest line width will be described below in section [3] (Effects).

3) Second Gate-Gate Electrode Layer

The second gate-gate electrode layer 22 is formed transverse to the second active region 15 and the fourth active region 17, as shown in FIG. 7. The second gate-gate electrode layer 22 functions as a gate electrode of the second load transistor Q6 and the second driver transistor Q4. The second gate-gate electrode layer 22 is formed in a manner to pass between the third p$^+$-type impurity layer 15$a$ and the fourth p$^+$-type impurity layer 15$b$, in the second active region 15. Thus, the second gate-gate electrode layer 22, the third p$^+$-type impurity layer 15$a$ and the fourth p$^+$-type impurity layer 15$b$ form the second load transistor Q6. Similarly, the second gate-gate electrode layer 22 is formed in a manner to pass between the fifth n$^+$-type impurity layer 17$b$ and the sixth n$^+$-type impurity layer 17$c$, in the fourth active region 17. Thus, the second gate-gate electrode layer 22, the fifth n$^+$-type impurity layer 17$b$ and the sixth n$^+$-type impurity layer 17$c$ form the second driver transistor Q4.

A contact pad layer 26 is formed on a side section of the second gate-gate electrode layer 22. The contact pad layer 26 is provided in a manner to extend from the side section of the second gate-gate electrode layer 22 along the X direction, and also is provided between the second active region 15 and the fourth active region 17. The contact pad layer 26 may be provided in the following manner. When a distance between the edges of the contact pad layer 26 and the fourth active region 17 is L3, the contact pad layer 26 may be formed to meet Expression 2 below.

$$L1 = L3 \qquad \text{(Expression 2)}$$

Those skilled in the art will understand the above expression to indicate that the distances L1 and L3 are substantially equal. Effects obtained when the contact pad layer 26 is provided to meet Expression 2 will be described below in the section [3] (Effects).

4) Auxiliary Word Line

The auxiliary word line 24 is formed transverse to the third active region 16 and the fourth active region 17, as shown in FIG. 7. The auxiliary word line 24 functions as a gate electrode of the first and second transfer transistors Q1 and Q2. The auxiliary word line 24 is formed in a manner to pass between the first n$^+$-type impurity layer 16$a$ and the second n$^+$-type impurity layer 16$b$, in the third active region 16. Thus, the auxiliary word line 24, the first n$^+$-type impurity layer 16$a$ and the second n$^+$-type impurity layer 16$b$ form the first transfer transistor Q1. Similarly, the auxiliary word line 24 is formed in a manner to pass between the fourth n$^+$-type impurity layer 17$a$ and the fifth n$^+$-type impurity layer 17$b$, in the fourth active region 17. Thus, the auxiliary word line 24, the fourth n$^+$-type impurity layer 17$a$ and the fifth n$^+$-type impurity layer 17$b$ form the second transfer transistor Q2.

5) Cross-sectional Structure of First Conductive Layer and Others

Figure 12:
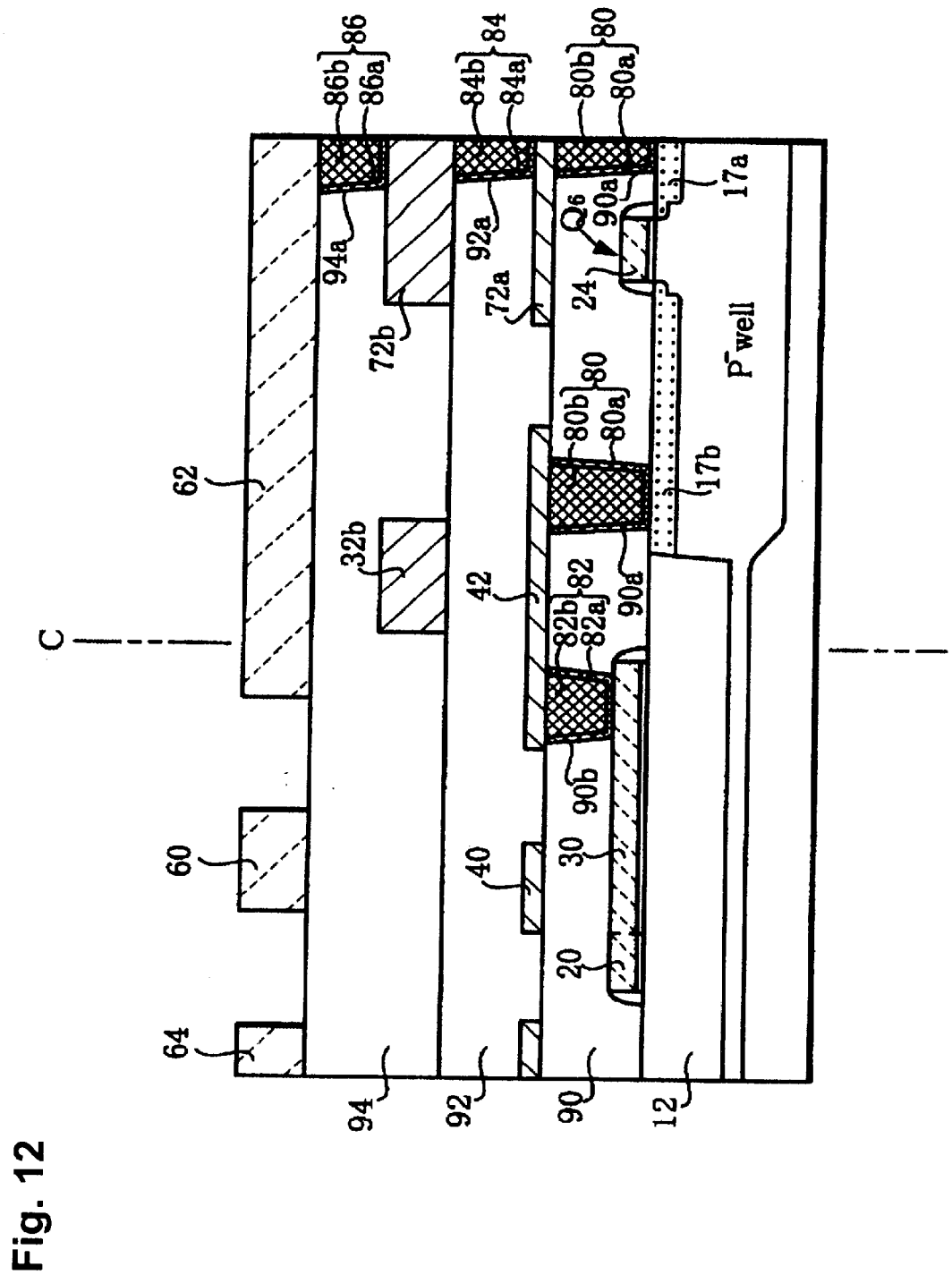
FIG. 12 schematically shows a cross-sectional view taken along a line A—A shown in FIG. 2–FIG. 11.
Figure 13:
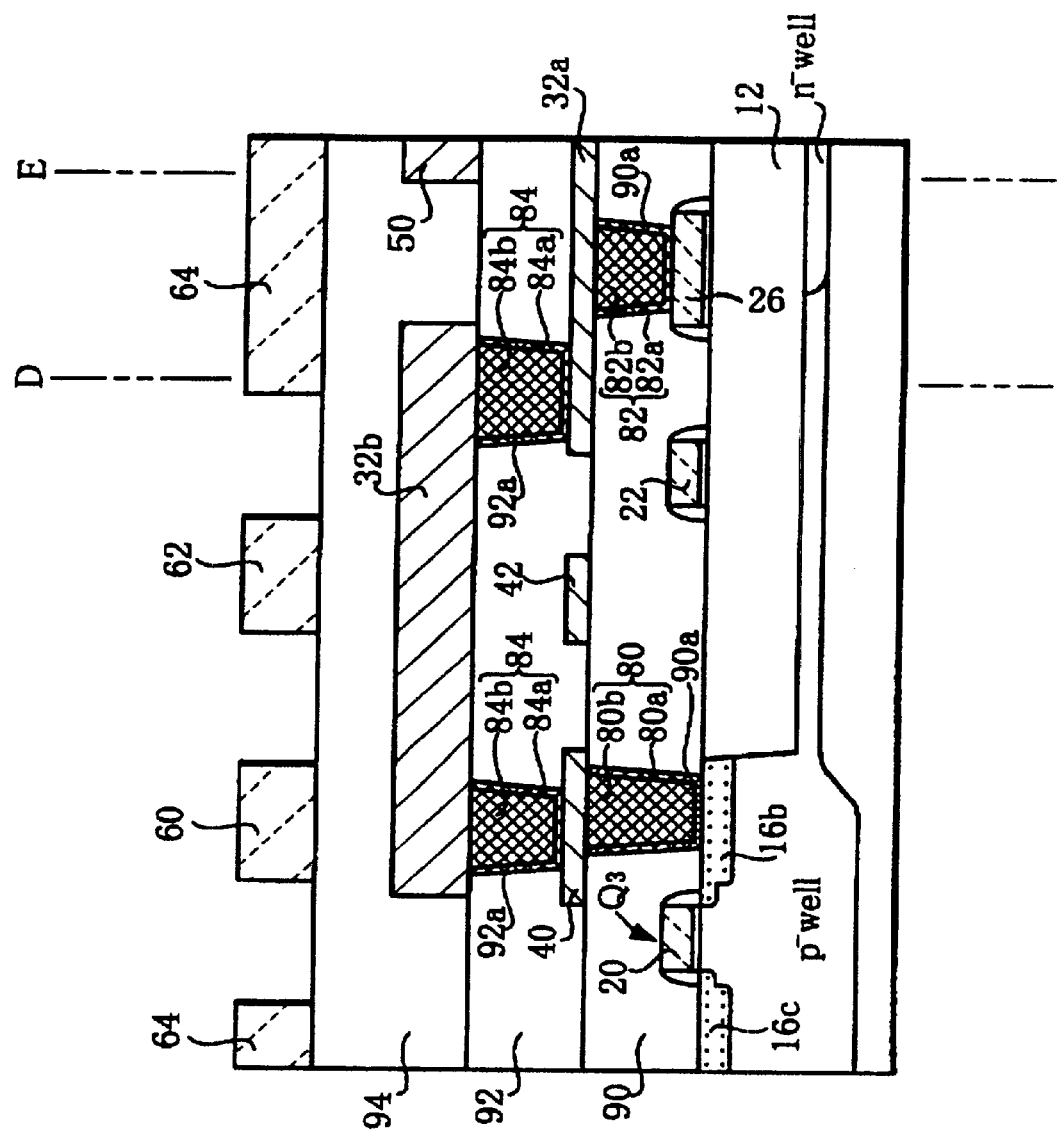
FIG. 13 schematically shows a cross-sectional view taken along a line B—B shown in FIG. 2–FIG. 11.

The first conductive layer may be formed by successively depositing a polysilicon layer and a silicide layer in layers. As shown in FIG. 12 and FIG. 13, a first interlayer dielectric layer 90 is formed on the field (e.g. 17$a$ and 17$b$) and the first conductive layer (e.g. 30 and 24). The first interlayer dielectric layer 90 may be formed through a planarization process utilizing, for example, a chemical mechanical polishing method.

(3) Second Conductive Layer

Figure 4:
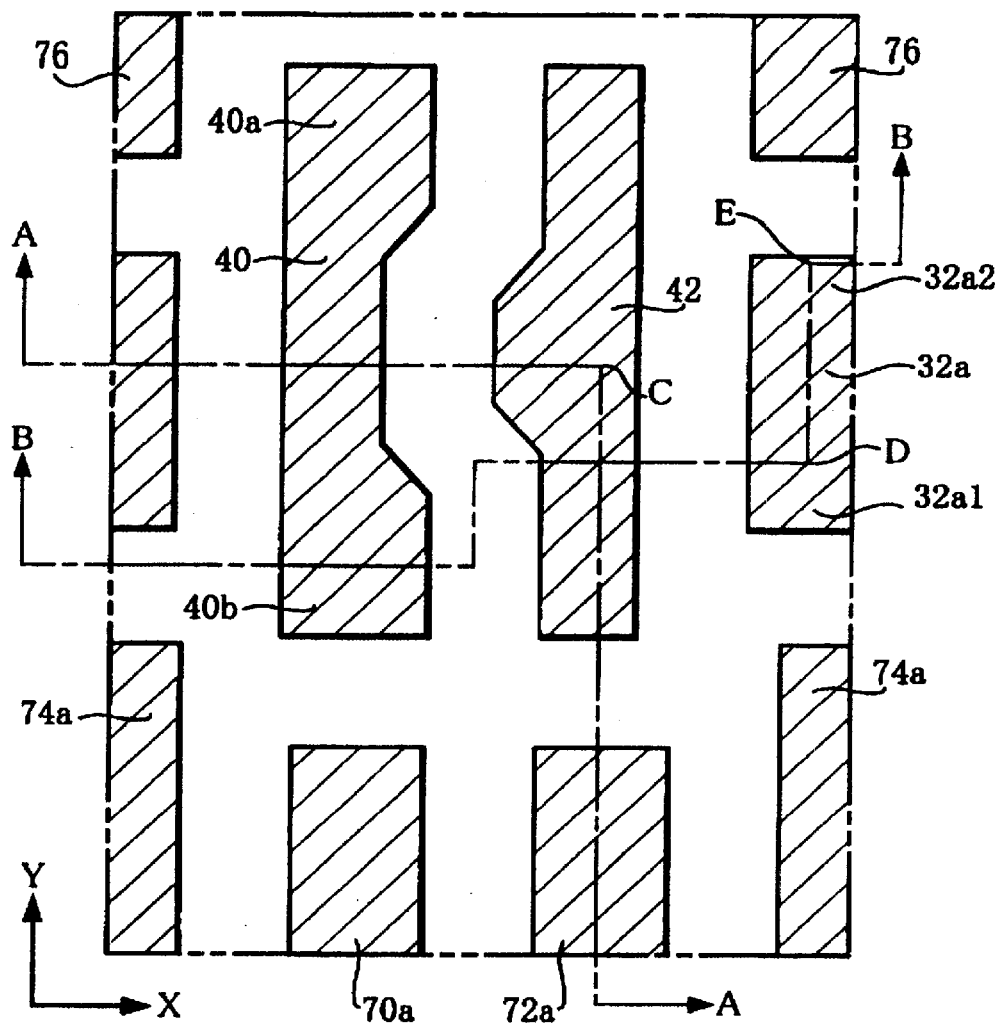
FIG. 4 schematically shows a plan view of a second conductive layer of the memory cell of the SRAM in accordance with the present embodiment.
Figure 8:
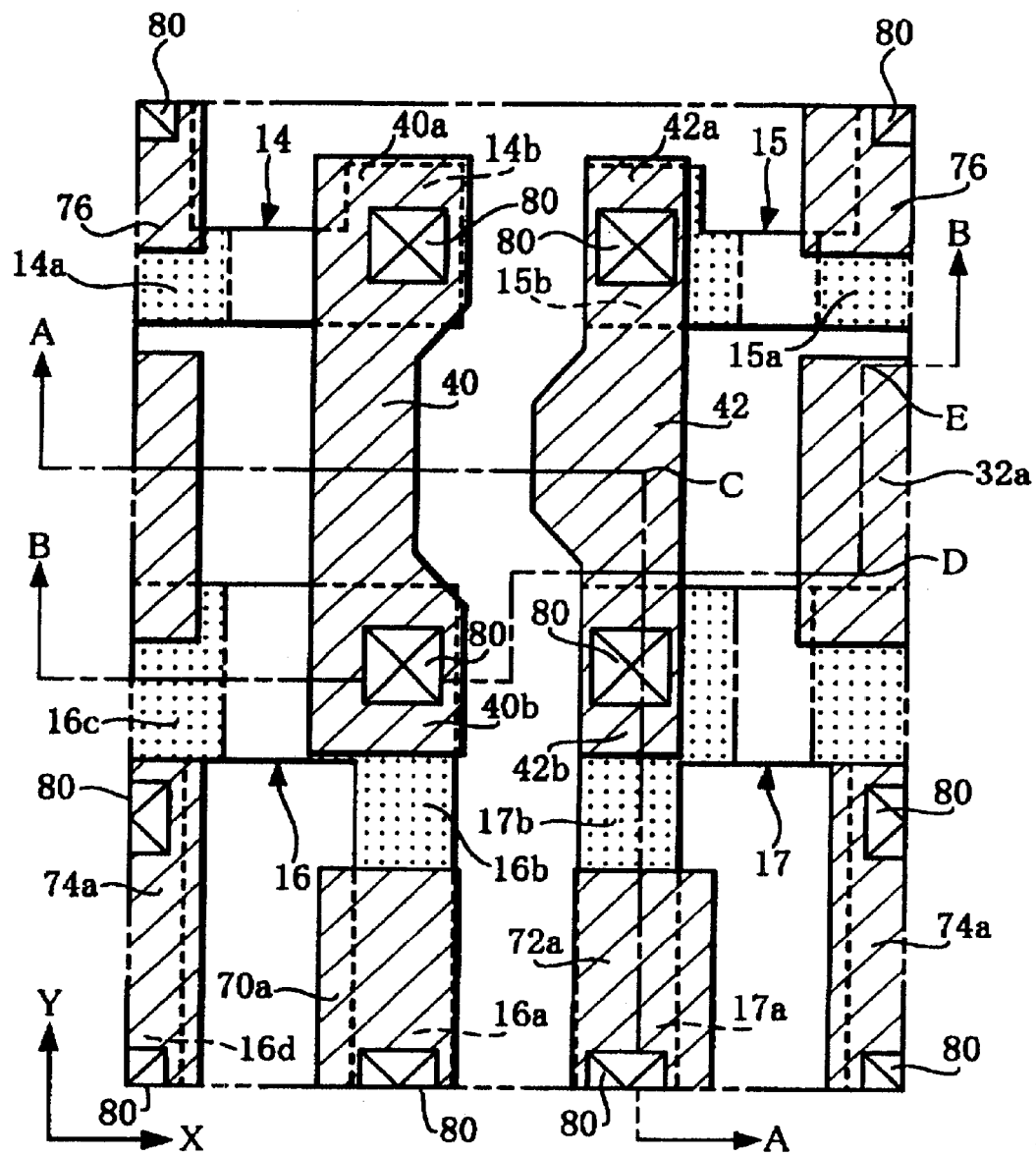
FIG. 8 schematically shows a plan view of the field and the second conductive layer of the memory cell of the SRAM in accordance with the present embodiment.
Figure 9:
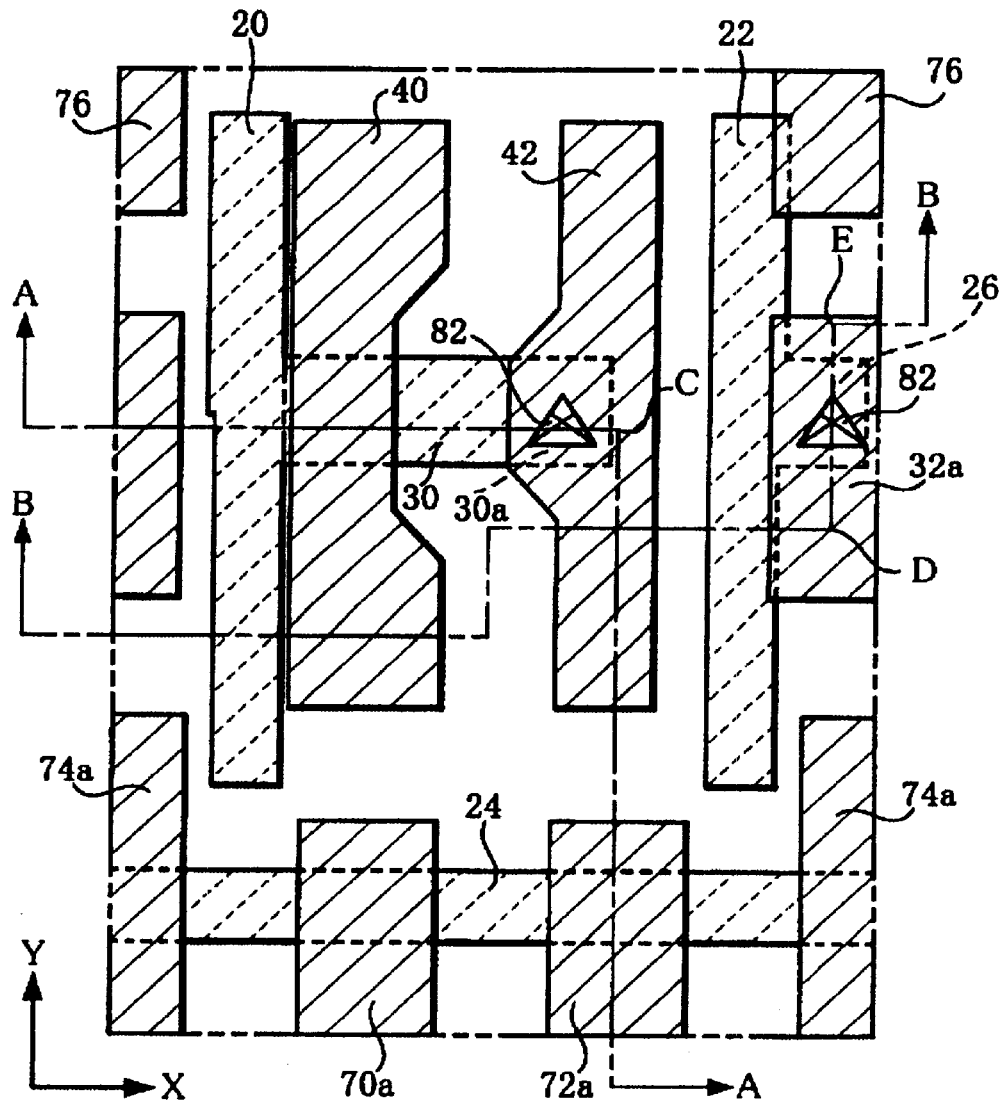
FIG. 9 schematically shows a plan view of the first conductive layer and the second conductive layer of the memory cell of the SRAM in accordance with the present embodiment.

Referring to FIG. 4, FIG. 8 and FIG. 9, the second conductive layer is described below. The second conductive layer is formed on the first interlayer dielectric layer 90.

The second conductive layer includes, as shown in FIG. 4, a first drain-drain wiring layer 40, a second drain-drain wiring layer 42, a lower layer section 32$a$ of a second drain-gate wiring layer, a first BL contact pad layer 70$a$, a first /BL contact pad layer 72$a$, a first Vss contact pad layer 74$a$ and a Vdd contact pad layer 76. The first drain-drain wiring layer 40, the second drain-drain wiring layer 42 and the lower layer section 32$a$ of the second drain-gate wiring layer are formed in a manner to extend along the Y direction. The first drain-drain wiring layer 40, the second drain-drain wiring layer 42 and the lower layer section 32$a$ of the second drain-gate wiring layer are spaced apart in the X direction. Components of the second conductive layer are concretely described below.

1) First Drain-Drain Wiring Layer

The first drain-drain wiring layer 40 has portions that overlap the first active region 14 and the third active region 16 as viewed in a plan view (see FIG. 8). Specifically, one end section 40$a$ of the first drain-drain wiring layer 40 is located above the second p$^+$-type impurity layer 14$b$. The one end section 40$a$ of the first drain-drain wiring layer 40 and the second p$^+$-type impurity layer 14$b$ are electrically connected to each other through a contact section between the field and the second conductive layer (herein below referred to as a "field/second-layer contact section") 80. The other end section 40$b$ of the first drain-drain wiring layer 40 is located above the second n$^+$-type impurity layer 16$b$. The other end section 40$b$ of the first drain-drain wiring layer 40 and the second n$^+$-type impurity layer 16$b$ are electrically connected to each other through another field/second-layer contact section 80.

2) Second Drain-Drain Wiring Layer

The second drain-drain wiring layer 42 has portions that overlap the second active region 15 and the fourth active region 17 as viewed in a plan view (see FIG. 8). Specifically, one end section 42$a$ of the second drain-drain wiring layer 42 is located above the fourth p$^+$-type impurity layer 15$b$. The one end section 42$a$ of the second drain-drain wiring layer 42 and the fourth p$^+$-type impurity layer 15$b$ are electrically connected to each other through a field/second-layer contact section 80. The other end section 42$b$ of the second drain-drain wiring layer 42 is located above the fifth n$^+$-type impurity layer 17$b$. The other end section 42$b$ of the second drain-drain wiring layer 42 and the fifth n$^+$-type impurity layer 17$b$ are electrically connected to each other through another field/.second-layer contact section 80.

Further, the second drain-drain wiring layer 42 has a portion that overlaps an end section 30a of the first drain-gate wiring layer 30 as viewed in a plan view (see FIG. 9). The second drain-drain wiring layer 42 and the end section 30a of the first drain-gate wiring layer 30 are electrically connected to each other through a contact section between the first conductive layer and the second conductive layer (hereafter referred to as a "first-layer/second-layer contact section") 82.

3) Lower Layer Section of Second Drain-Gate Wiring Layer

The lower layer section 32a of the second drain-gate wiring layer is formed on the opposite side of the first drain-drain wiring layer 40 with respect to the second drain-drain wiring layer 42 as being a reference. The lower layer section 32a of the second drain-gate wiring layer has a portion that overlaps the contact pad layer 26 as viewed in a plan view (see FIG. 9). The lower layer section 32a of the second drain-gate wiring layer, and the contact pad layer 26 are electrically connected to each other through another first-layer/second-layer contact section 82.

4) First BL Contact Pad Layer

The first BL contact pad layer 70a is located above the first n$^+$-type impurity layer 16a in the third active region 16 (see FIG. 8). The first BL contact pad layer 70a and the first n$^+$-type impurity layer 16a are electrically connected to each other through a field/second-layer contact section 80.

5) First /BL Contact Pad Layer

The first /BL contact pad layer 72a is located above the fourth n$^+$-type impurity layer 17a in the fourth active region 17 (see FIG. 8). The first /BL contact pad layer 72a and the fourth n$^+$-type impurity layer 17a are electrically connected to each other through a field/second-layer contact section 80.

6) First Vss Contact Pad Layer

The first Vss contact pad layers 74a are located above the sources of the driver transistors Q3 and Q4 (for example, the third n$^+$-type impurity layer 16c) and the well contact region (for example, the fifth p$^+$-type impurity layer 16d) (see FIG. 8). Each of the first Vss contact pad layers 74a is electrically connected to the source of each of the driver transistors Q3 and Q4 (for example, the third n$^+$-type impurity layer 16c) through a field/second-layer contact section 80. Also, the first Vss contact pad layer 74a is electrically connected to the well contact region (for example, the fifth p$^+$-type impurity layer 16d) through another field/second-layer contact section 80.

7) Vdd Contact Pad Layer

Each of the Vdd contact pad layers 76 is located above the source (for example, the first p$^+$-type impurity layer 14a) of each of the load transistors Q5 and Q6. Each of the Vdd contact pad layers 76 is electrically connected to the source (for example, the first p$^+$-type impurity layer 14a) of each of the load transistors Q5 and Q6 through a field/second-layer contact section 80.

8) Cross-Sectional Structure of Second Conductive Layer

Next, a cross-sectional structure of the second conductive layer is described with reference to FIG. 12 and FIG. 13. The second conductive layer is preferably formed from, for example, a layer of nitride of a high melting point metal. The thickness of the second conductive layer may be preferably for example 100–200 nm, and more preferably be 140–160 nm. The layer of nitride of a high melting point metal may be formed from, for example, titanium nitride. Because the second conductive layer is formed from a layer of nitride of a high melting point metal, the thickness of the second conductive layer can be made smaller, and miniature processing thereof can be readily conducted. Accordingly, the cell area can be reduced.

Also, the second conductive layer may have either one of the following structures. 1) It may have a structure in which a layer of nitride of a high melting point metal is formed on a metal layer formed from a high melting point metal. In this case, the metal layer formed from a high melting point metal is an under-layer, and may be formed of a titanium layer, for example. Titanium nitride may be used as a material of the layer of nitride of a high melting point metal. 2) The second conductive layer may be formed of a metal layer of a high melting point metal alone.

Next, a cross-sectional structure of a field/second-layer contact section 80 is described with reference to FIG. 12 and FIG. 13. The field/second-layer contact section 80 is formed in a manner to fill a through hole 90a that is formed in the first interlayer dielectric layer 90. The field/second-layer contact section 80 includes a barrier layer 80a, and a plug 80b formed over the barrier layer 80a. Titanium and tungsten may be used as material of the plugs. The barrier layer 80a may preferably be formed from a metal layer of a high melting point metal, and a layer of nitride of a high melting point metal formed over the metal layer. For example, titanium may be used as material of the metal layer of a high melting point metal. Titanium nitride, for example, may be used as material of the layer of nitride of a high melting point metal.

Next, a cross-sectional structure of a first-layer/second-layer contact section 82 is described with reference to FIG. 12 and FIG. 13. The first-layer/second-layer contact section 82 is formed in a manner to fill a through hole 90b that is formed in the first interlayer dielectric layer 90. The first-layer/second-layer contact section 82 may have the same structure as that of the field/second-layer contact section 80 described above.

A second interlayer dielectric layer 92 is formed in a manner to cover the second conductive layer. The second interlayer dielectric layer 92 may be formed through a planarization process using, for example, a chemical mechanical polishing method.

(4) Third Conductive Layer

Figure 5:
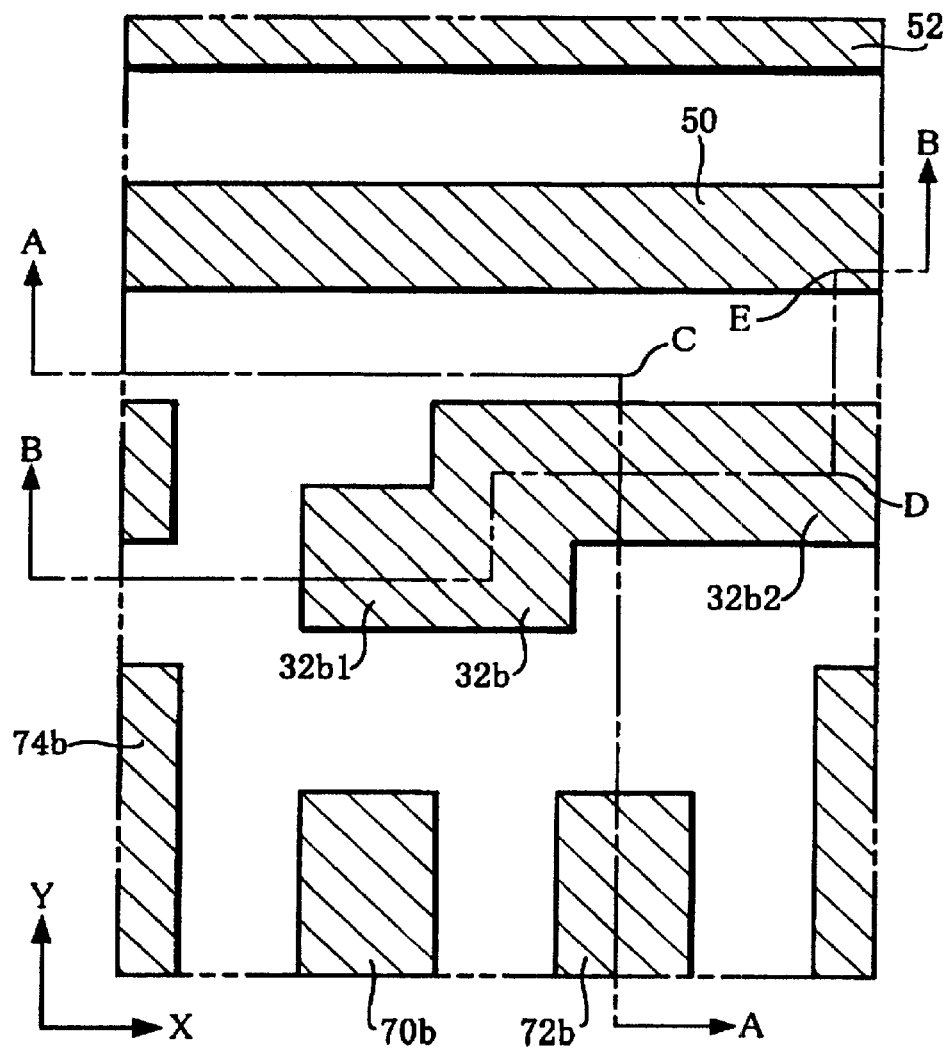
FIG. 5 schematically shows a plan view of a third conductive layer of the memory cell of the SRAM in accordance with the present embodiment.

The third conductive layer is described below with reference to FIG. 5 and FIG. 10. The third conductive layer is formed on the second interlayer dielectric layer 92. The third conductive layer includes an upper layer section 32b of the second drain-gate wiring layer, a main word line 50, a Vdd wiring 52, a second BL contact pad layer 70b, a second /BL contact pad layer 72b and a second Vss contact pad layer 74b. The upper layer section 32b of the second drain-gate wiring layer, the main word line 50 and the Vdd wiring 52 are formed in a manner to extend along the X direction. The second BL contact pad layer 70b, the second /BL contact pad layer 72b and the second Vss contact pad layer 74b are formed in a manner to extend in the Y direction. Components of the third conductive layer are concretely described below.

1) Upper Layer Section of Second Drain-Gate Wiring Layer

Figure 10:
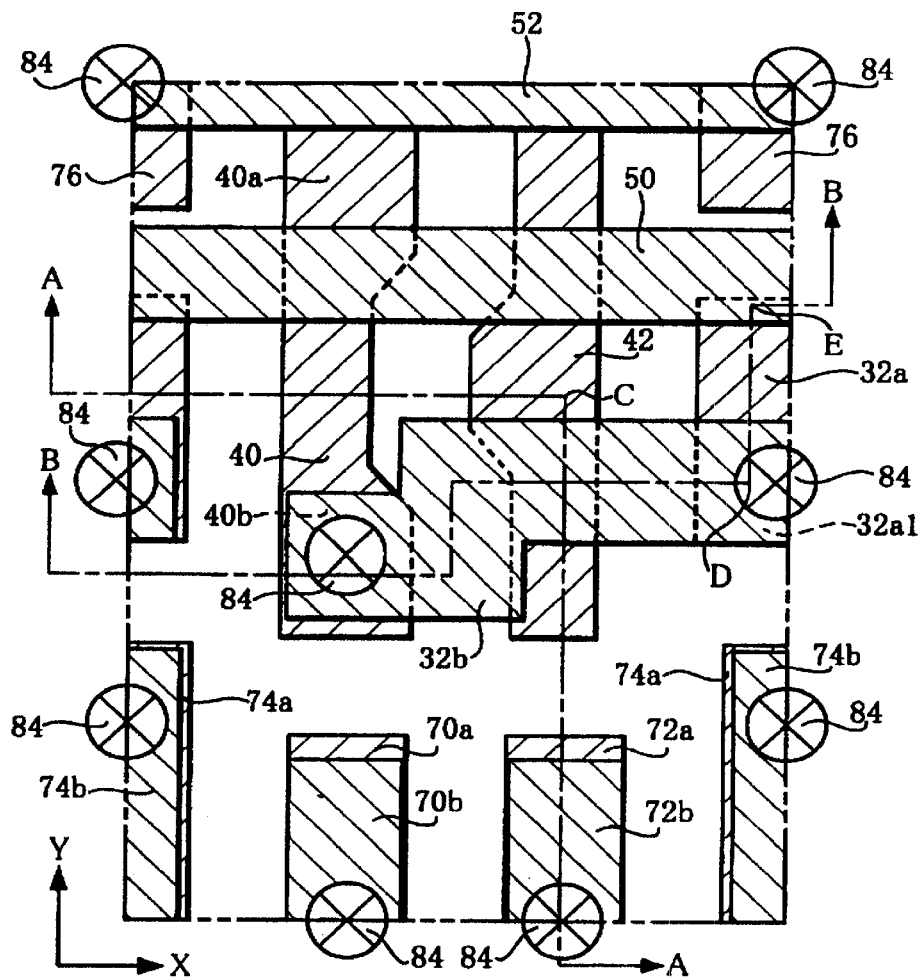
FIG. 10 schematically shows a plan view of the second conductive layer and the third conductive layer of the memory cell of the SRAM in accordance with the present embodiment.

The upper layer section 32b of the second drain-gate wiring layer is formed transverse to the second drain-drain wiring layer 42 in the second conductive layer, as shown in FIG. 10. Specifically, the upper layer section 32b of the second drain-gate wiring layer is formed from an area above the end section 40b of the first drain-drain wiring layer 40 to an area above an end section 32a of the lower layer section 32a of the second drain-gate wiring layer. The upper layer section 32b of the second drain-gate wiring layer is electrically connected to the end section 40b of the first drain-drain wiring layer 40 through a contact section between the second conductive layer and the third conductive layer (herein after referred to as a "second-layer/third-layer contact section") 84. Also, the upper layer section 32*b* of the second drain-gate wiring layer is electrically connected to the end section 32*a*1 of the lower layer section 32*a* of the second drain-gate wiring layer through another second-layer/third-layer contact section 84.

As a result, as shown in FIG. 1, the first drain-drain wiring layer 40 in the second conductive layer and the second gate-gate electrode layer 22 in the first conductive layer are electrically connected to each other through second-layer/third-layer contact section 84, the upper layer section 32*b* of the second drain-gate wiring layer, another second-layer/third-layer contact section 84, the lower layer section 32*a* of the second drain-gate wiring layer, a first-layer/second-layer contact section 82, and the contact pad layer 26.

2) Vdd Wiring

The Vdd wiring 52 is formed in a manner to pass over the Vdd contact pad layer 76, as shown in FIG. 10. The Vdd wiring 52 is electrically connected to the Vdd contact pad layer 76 through the second-layer/third-layer contact section 84.

3) Second BL Contact Pad Layer

The second BL contact pad layer 70*b* is located above the first BL contact pad layer 70*a*. The second BL contact pad layer 70*b* is electrically connected to the first BL contact pad layer 70*a* through a second-layer/third-layer contact section 84.

4) Second /BL Contact Pad Layer

The second /BL contact pad layer 72*b* is located above the first /BL contact pad layer 72*a*. The second /BL contact pad layer 72*b* is electrically connected to the first /BL contact pad layer 72*a* through a second-layer/third-layer contact section 84.

5) Second Vss Contact Pad Layer

The second Vss contact pad layer 74*b* is located above the first Vss contact pad layer 74*a*. The second Vss contact pad layer 74*b* is electrically connected to the first Vss contact pad layer 74*a* through a second-layer/third-layer contact section 84.

6) Cross-sectional Structure of Third Conductive Layer

Next, a cross-sectional structure of the third conductive layer is described with reference to FIG. 12 and FIG. 13. The third conductive layer has a structure in which, for example, a layer of nitride of a high melting point metal, a metal layer, and a layer of nitride of a high melting point metal, in this order from the bottom, are successively stacked in layers. For example, titanium nitride may be used as material of the layer of nitride of a high melting point metal. Aluminum, copper or an alloy of these metals, for example, may be used as material of the metal layer.

Next, a cross-sectional structure of a second-layer/third-layer contact section 84 is described with reference to FIG. 12. The second-layer/third-layer contact section 84 is formed in a manner to fill a through hole 92*a* formed in the second interlayer dielectric layer 92. The second-layer/third-layer contact section 84 may be provided with the same structure as that of the field/second-layer contact section 80 described above.

A third interlayer dielectric layer 94 is formed in a manner to cover the third conductive layer. The third interlayer dielectric layer 94 may be formed through a planarization process using, for example a chemical mechanical polishing method.

(5) Fourth Conductive Layer

Figure 6:
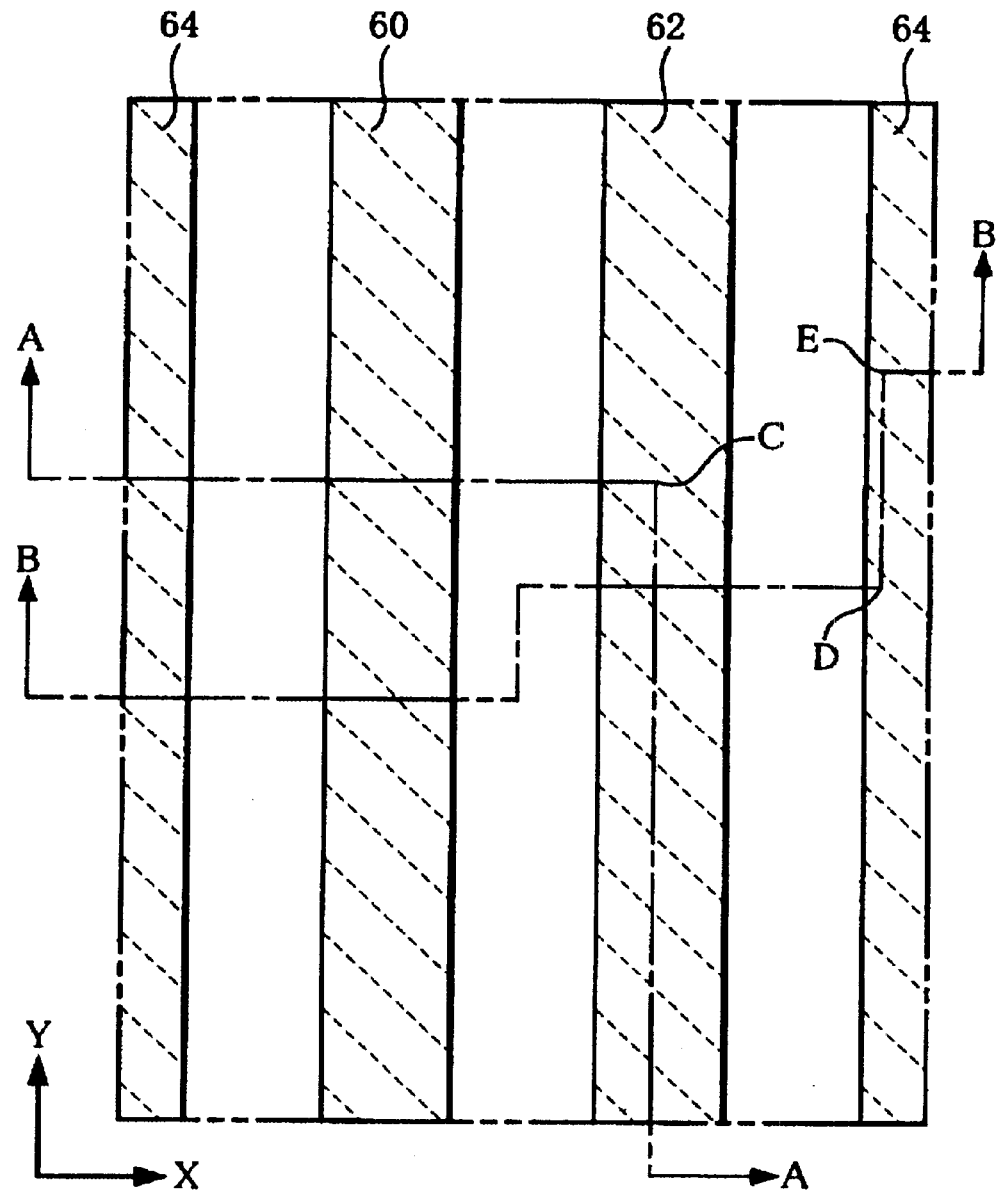
FIG. 6 schematically shows a plan view of a fourth conductive layer of the memory cell of the SRAM in accordance with the present embodiment.

The fourth conductive layer is described below with reference to FIG. 6 and FIG. 11. The fourth conductive layer is formed on the third interlayer dielectric layer 94. The fourth conductive layer includes a bit line 60, a /bit line 62 and a Vss wiring 64. The bit line 60, the /bit line 62 and the Vss wiring 64 are formed in a manner to extend along the Y direction.

1) Bit Line

Figure 11:
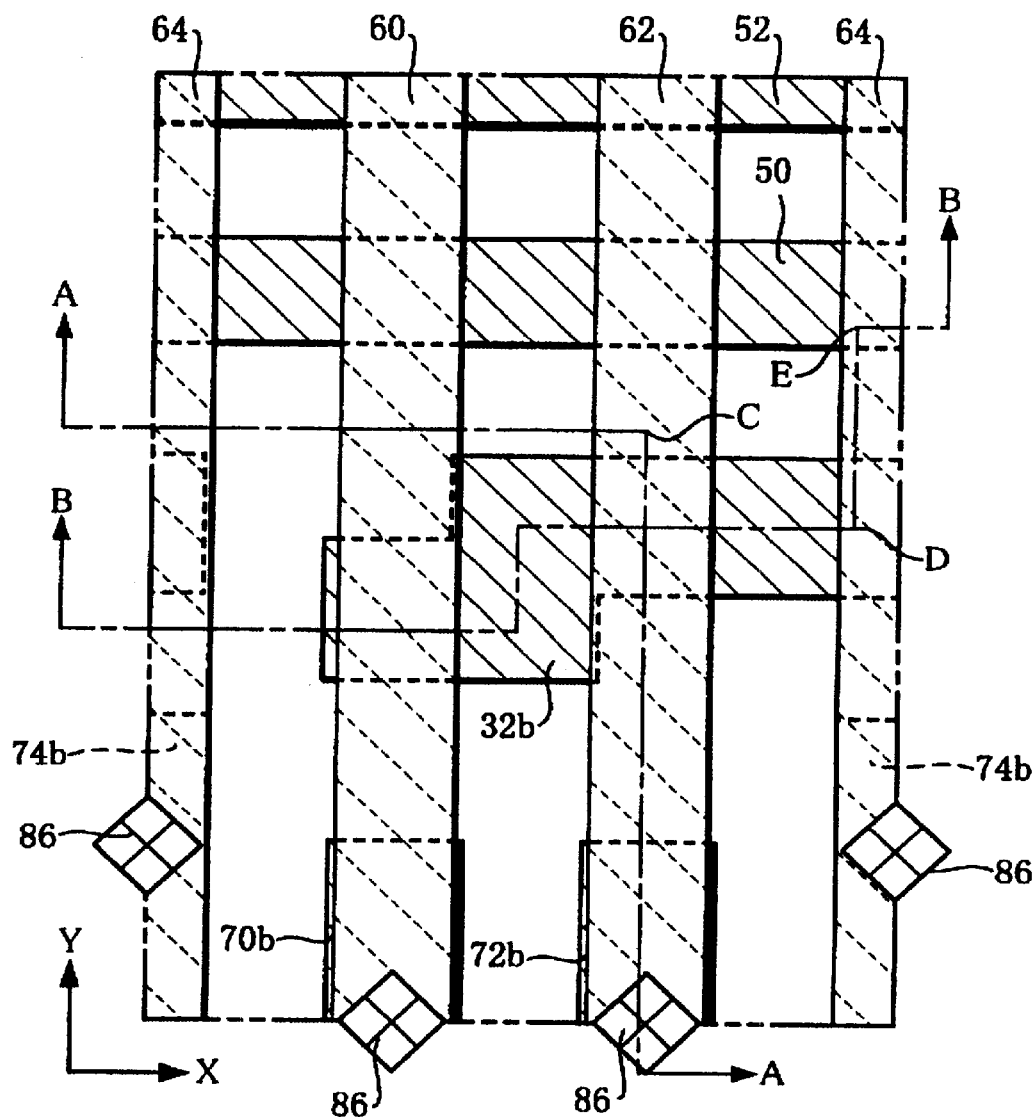
FIG. 11 schematically shows a plan view of the third conductive layer and the fourth conductive layer of the memory cell of the SRAM in accordance with the present embodiment.

The bit line 60 is formed in a manner to pass over the second BL contact pad layer 70*b*, as shown in FIG. 11. The bit line 60 is electrically connected to the second BL contact pad layer 70*b* through a contact section between the third conductive layer and the fourth conductive layer (herein below referred to as a "third-layer/fourth-layer contact section") 86.

2) /Bit Line

The /bit line 62 is formed in a manner to pass over the second /BL contact pad layer 72*b*, as shown in FIG. 11. The /bit line 62 is electrically connected to the /second BL contact pad layer 72*b* through a third-layer/fourth-layer contact section 86.

3) Vss Wiring

The Vss wiring 64 is formed in a manner to pass over the second Vss contact pad layer 74*b*, as shown in FIG. 11. The Vss wiring 64 is electrically connected to the second Vss contact pad layer 74*b* through a third-layer/fourth-layer contact section 86.

4) Cross-Sectional Structure of Fourth Conductive Layer

Next, a cross-sectional structure of the fourth conductive layer is described with reference to FIG. 12 and FIG. 13. The fourth conductive layer may have the same structure as the structure of the third conductive layer described above.

Next, a cross-sectional structure of a third-layer/fourth-layer contact section 86 is described with reference to FIG. 12. The third-layer/fourth-layer contact section 86 is formed in a manner to fill a through hole 94*a* that is formed in the third interlayer dielectric layer 94. The third-layer/fourth-layer contact section 86 may have the same structure as the structure of the field/second-layer contact section 80 described above. Although not shown in FIG. 12 or FIG. 13, a passivation layer may be formed on the fourth conductive layer.

[3] Effects

Effects of the semiconductor device in accordance with the present embodiment will be described below with reference to FIGS. 16–18.

Figure 16:
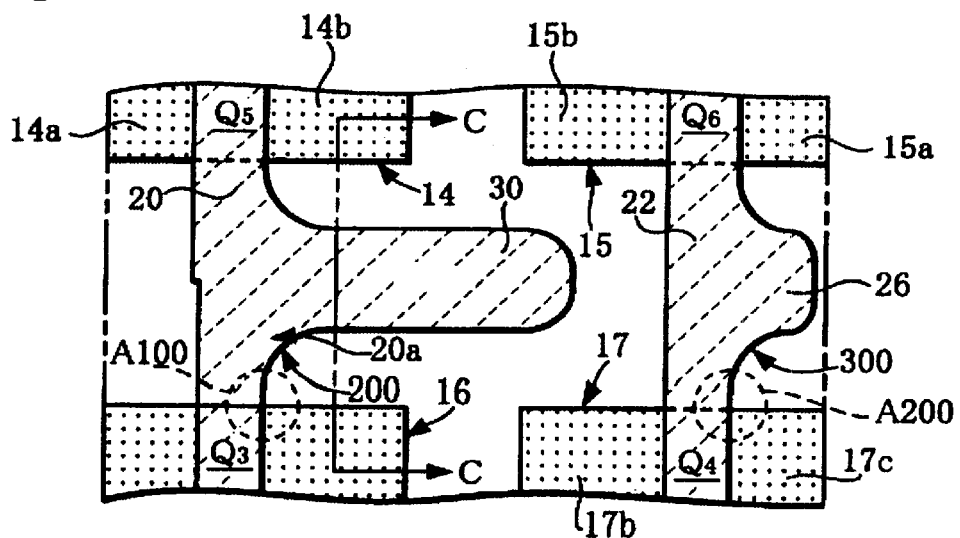
FIG. 16 shows a plan view of the field/first conductive layer for describing the effects.
Figure 17:
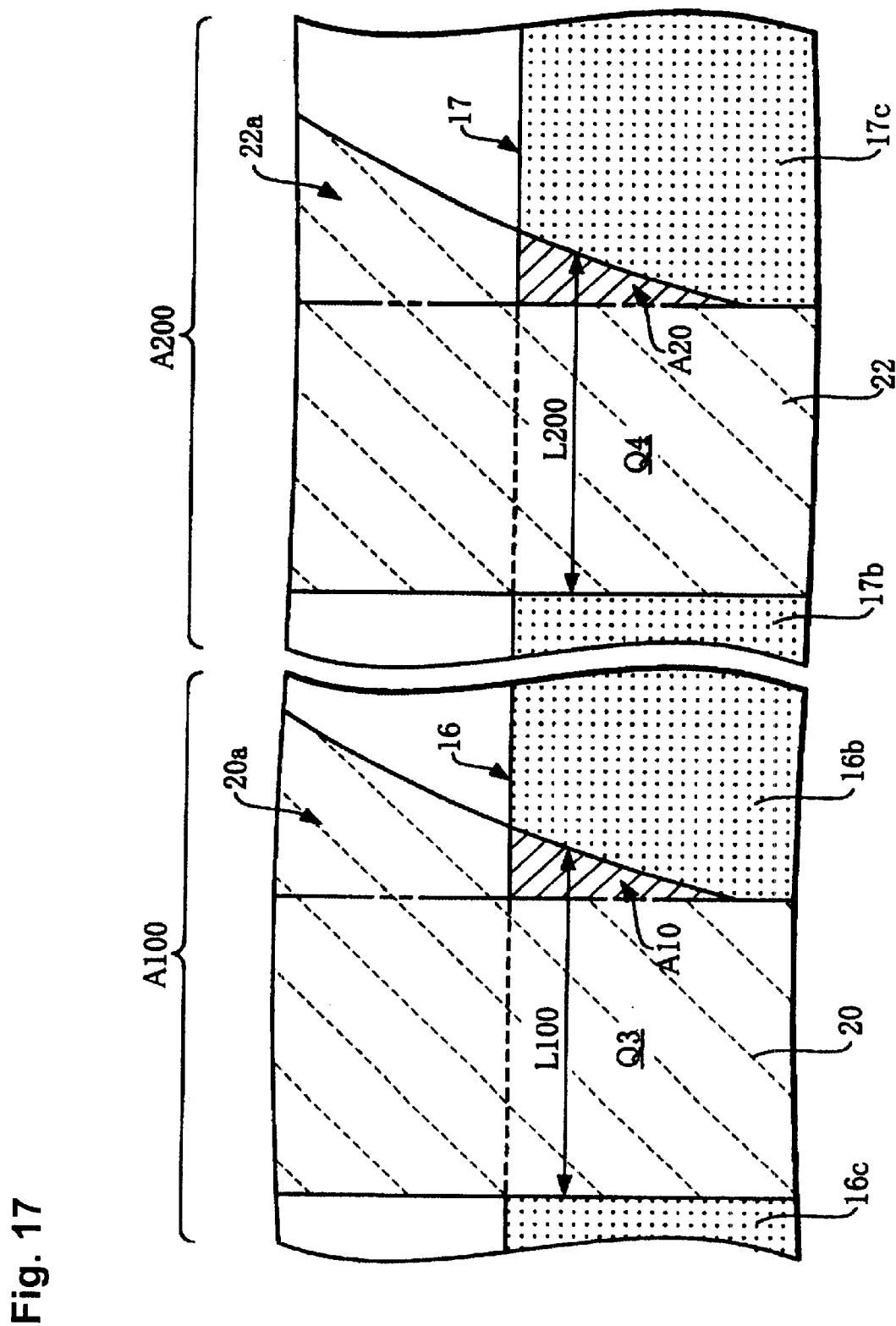
FIG. 17 shows an enlarged plan view of portions A100 and A200 shown in FIG. 16.

(1) In accordance with the present embodiment, as shown in FIG. 16, a corner section 200 is formed with the first gate-gate electrode layer 20 and the first drain-gate wiring layer 30. When the first gate-gate electrode layer 20 and the first drain-gate wiring layer 30 are formed, their patterns are defined by a resist pattern. However, in an attempt to form a resist pattern having a corner section, the resist pattern may be rounded at the corner section due to the optical proximity effect. Therefore, as shown in FIG. 16, there may be occasions when the first gate-gate electrode layer 20 and the first drain-gate wiring layer 30 would be formed with the corner section 200 being rounded. When the corner section 200 defined by the first gate-gate electrode layer 20 and the first drain-gate wiring layer 30 is rounded, a rounded section 20*a* of the first gate-gate electrode layer 20 could overlap the third active region 16 due to an alignment error, as shown in FIG. 17. When the rounded section 20*a* overlaps the third active region 16, the gate length L100 of the first driver transistor Q3 changes. If the gate length L100 of the first driver transistor Q3 changes, the performance of the first driver transistor Q3 would change.

Similarly, there may be occasion when a corner section 300 defined by the second gate-gate electrode layer 22 and the contact pad layer 26 may be rounded, as shown in FIG.

16. A rounded section 22a of the second gate-gate electrode layer 22 could overlap the fourth active region 17 due to an alignment error, as shown in FIG. 17. In this case, the gate length L200 of the second driver transistor Q4 changes. If the gate length L200 of the second driver transistor Q4 changes, the performance of the second driver transistor Q4 would change.

When the area of a region A10 where the rounded section 20a of the first gate-gate electrode layer overlaps the third active region 16 is different from the area of a region A20 where the rounded section 22a of the second gate-gate electrode layer 22 overlaps the fourth active region 17, the gate length L100 of the first driver transistor Q3 would differ from the gate length L200 of the second driver transistor Q4. When the gate length L100 of the first driver transistor Q3 is different from the gate length L200 of the second driver transistor Q4, the capability of the first driver transistor Q3 would differ from the capability of the second driver transistor Q4. When the capability of the first driver transistor Q3 differs from the capability of the second driver transistor Q4, unbalance occurs between the driver transistors Q3 and Q4, and the operation margin (stability) of the memory cells lowers.

However, when the contact pad layer 26 is set to meet Expression 2 (L1=L3), the following effects are obtained. By setting the contact pad layer in this manner, even when an alignment error occurs, the area of the region A10 where the rounded section 20a of the first gate-gate electrode layer overlaps the third active region 16 can be made equal to the area of the region A20 where the rounded section 22a of the second gate-gate electrode layer 22 overlaps the fourth active region 17. In other words, a change in the gate length L100 of the first driver transistor Q3 can be made equal to a change in the gate length L200 of the second driver transistor Q4. As a result, occurrence of a difference in capability between the first driver transistor Q3 and the second driver transistor Q4 can be reduced. Accordingly, the operation margin (stability) of the memory cells can be improved. (2) When the first drain-gate wiring layer 30 meets Expression 1 (L1≧L2), the following effects can be obtained.

Figure 18:
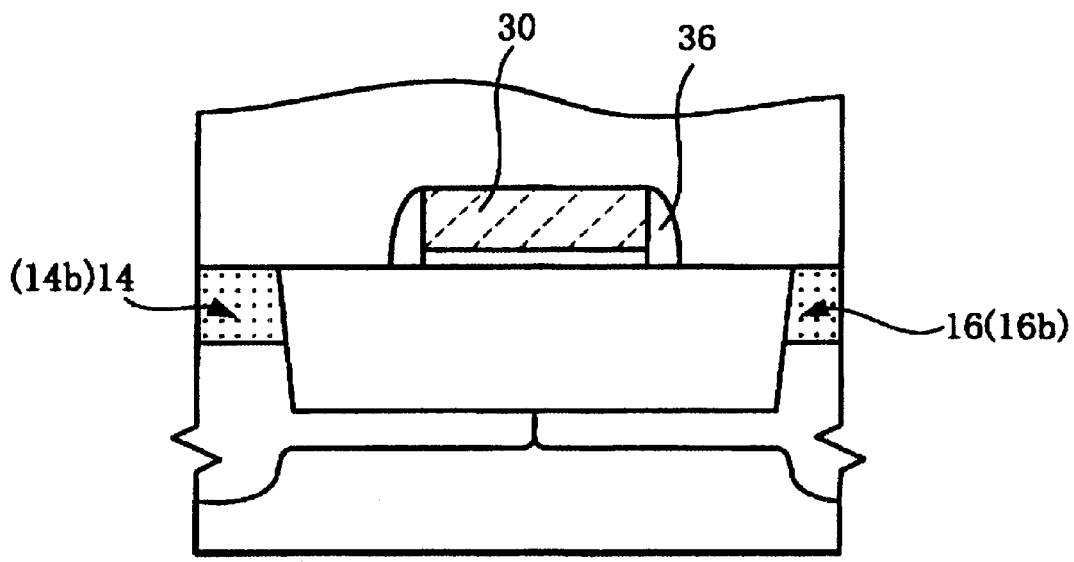
FIG. 18 schematically shows a cross-sectional view taken along a line C—C shown in FIG. 16.

As shown in FIG. 18, sidewalls 36 are formed on sides of the first drain-gate wiring layer 30. When the first drain-gate wiring layer 30 is formed to meet the above Expression 1, it reduces the chances of the end sections of the sidewalls 36 protruding into the third active region 16 even when an alignment error occurs. In other words, when an impurity layer that is to become a source or drain of the first driver transistor is formed by injecting ions, using the first conductive layer as a mask, the first driver transistor is readily formed without changing the gate width of the first driver transistor Q3. Accordingly, the first driver transistor Q3 having the desired characteristics can be readily formed, and memory cells having the desired characteristics can be readily formed.

It is noted that, when the first drain-gate wiring layer 30 is set to meet the above Expression 1, sidewalls of the first drain-gate wiring layer 30 may overlap the first active region 14. However, since the first load transistor Q5 needs only a predetermined amount of current flow, overlapping between the sidewalls and a part that is to become the first active region may reduce the gate width of the first load transistor Q5, but would have an insignificant impact on the memory cell characteristics.

(3) Also, the first drain-gate wiring layer 30 may have the smallest line width among wirings that are formed. This reduces the chances of the end sections of the sidewalls 36 protruding into the third active region 16 even when an alignment error occurs. As a result, the first driver transistor Q3 is readily formed without changing the gate width of the first driver transistor Q3. Accordingly, the first driver transistor Q3 having the desired characteristics can be readily formed, and memory cells having the desired characteristics can be readily formed.

(4) The first drain-gate wiring layer and the second drain-gate wiring layer may be formed in the same conductive layer. However, this structure may make it difficult to reduce the cell area due to the high pattern density of the conductive layer where the first and second drain-gate wiring layers are formed.

In accordance with a preferred embodiment of the present invention, the first drain-gate wiring layer 30 is located in the first conductive layer. Also, the second drain-gate wiring layer has a structure that is divided into the lower layer section 32a of the second drain-gate wiring layer and the upper layer section 32b of the second drain-gate wiring layer. The lower layer section 32a of the second drain-gate wiring layer is located in the second conductive layer, and the upper layer section 32b of the second drain-gate wiring layer is located in the third conductive layer. Consequently, the first drain-gate wiring layer and the second drain-gate wiring layer are formed in different layers. Since the first drain-gate wiring layer and the second drain-gate wiring layer are not formed in the same layer, the pattern density of the wiring layer can be reduced. As a result, with the memory cell in accordance with the present embodiment, the cell area can be reduced.

[4] Example of Application of SRAM to Electronic Apparatus

Figure 14:
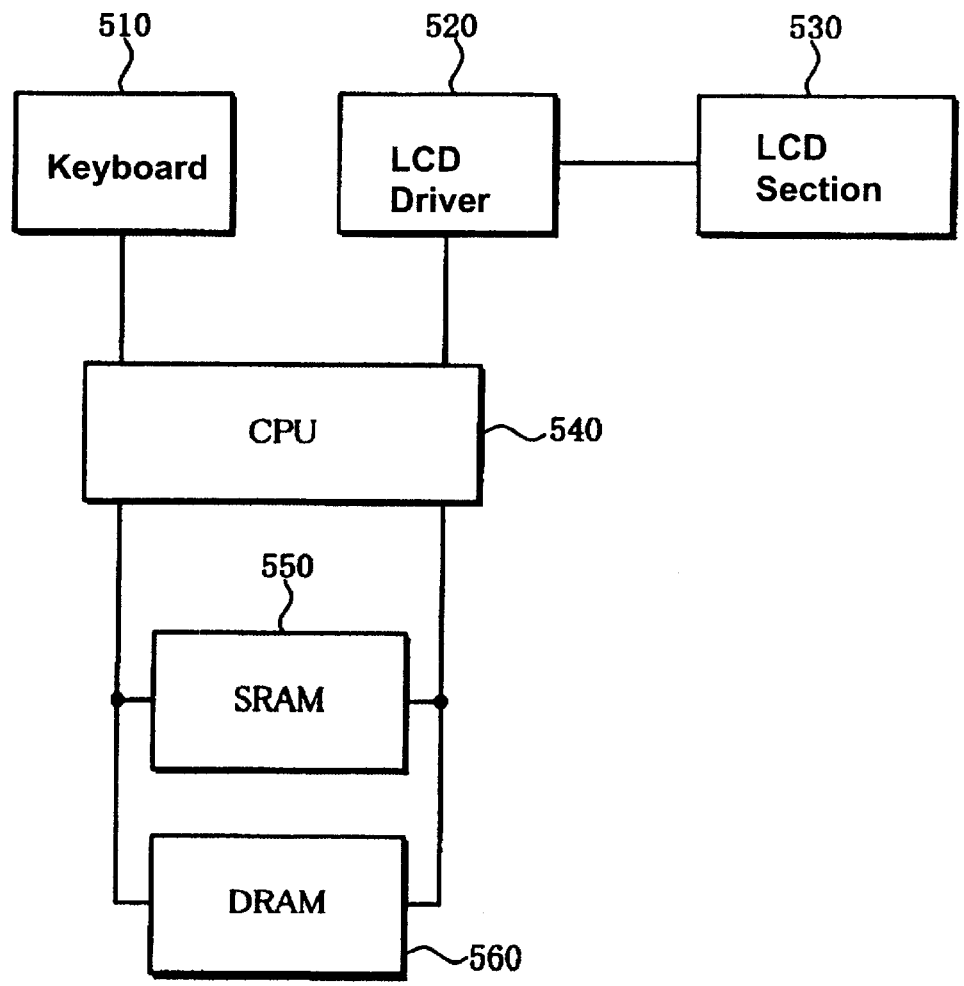
FIG. 14 shows a block diagram of a part of a mobile telephone system equipped with the SRAM in accordance with the present embodiment.

The SRAM in accordance with the present embodiment may be applied to electronic apparatus such as mobile equipment. FIG. 14 shows a block diagram of a part of a mobile telephone system. A CPU 540, an SRAM 550 and a DRAM 560 are mutually connected via a bus line. Further, the CPU 540 is connected to a keyboard 510 and an LCD driver 520 via the bus line. The LCD driver 520 is connected to a liquid crystal display section 530 via the bus line. The CPU 540, the SRAM 550 and the DRAM 560 constitute a memory system.

Figure 15:
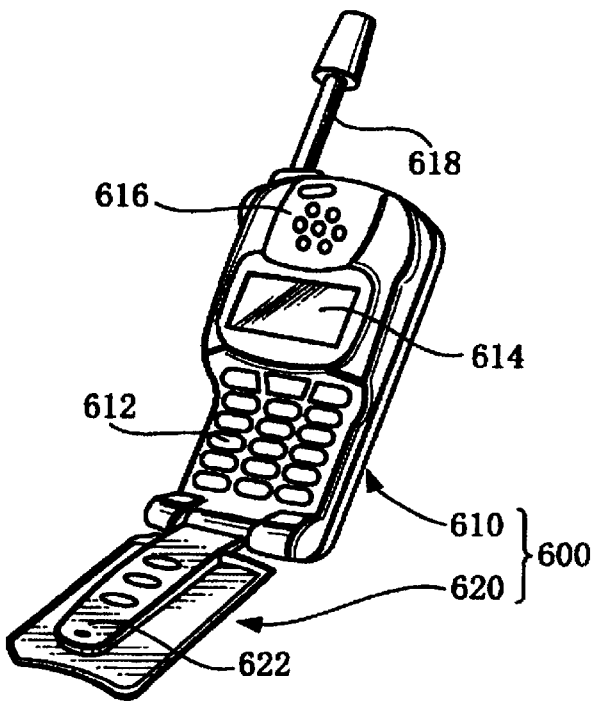
FIG. 15 shows a perspective view of a mobile telephone that is equipped with the mobile telephone system shown in FIG. 14.

FIG. 15 shows a perspective view of a mobile telephone 600 that is equipped with the mobile telephone system shown in FIG. 14. The mobile telephone 600 is equipped with a main body section 610 including a keyboard 612, a liquid crystal display section 614, a receiver section 616 and an antenna section 618, and a lid section 620 including a transmitter section 622.

Although embodiments are described in detail above, the present invention is not limited to the embodiments, and a variety of modifications can be made within the scope of the subject matter of the present invention. Thus, it is intended that the present invention cover modifications and variations that come within the scope of the appended claims and their equivalents.

What is claimed is:

1. A semiconductor device having a memory cell including a first load transistor, a second load transistor, a first driver transistor, a second driver transistor, a first transfer transistor, and a second transfer transistor, the semiconductor device comprising:

a first gate-gate electrode layer including a gate electrode of the first load transistor and a gate electrode of the first driver transistor; and a first drain-gate wiring layer that is continuous with the first gate-gate electrode layer, provided in a manner to extend in a direction transverse to the first gate-gate electrode layer, and provided at least between an active region for the first load transistor and an active region for the first driver transistor, wherein a distance L1 between the edges of the first drain-gate wiring layer and the active region for the first driver transistor is greater than or equal to a distance L2 between the edges of the first drain-gate wiring layer and the active region for the first load transistor.

2. A semiconductor device having a memory cell including a first load transistor, a second load transistor, a first driver transistor, a second driver transistor, a first transfer transistor, and a second transfer transistor, the semiconductor device comprising:

a first gate-gate electrode layer including a gate electrode of the first load transistor and a gate electrode of the first driver transistor;

a second gate-gate electrode layer including a gate electrode of the second load transistor and a gate electrode of the second driver transistor;

a first drain-gate wiring layer that is continuous with the first gate-gate electrode layer, provided in a manner to extend in a direction transverse to the first gate-gate electrode layer, and provided at least between an active region for the first load transistor and an active region for the first driver transistor; and a contact pad layer that is continuous with the second gate-gate electrode layer, provided in a manner to extend in a direction transverse to the second gate-gate electrode layer, and provided between an active region for the second load transistor and an active region for the second driver transistor, wherein a distance L1 between the edges of the first drain-gate wiring layer and the active region for the first driver transistor is substantially equal to a distance L3 between the edges of the contact pad layer and the active region for the second driver transistor is L3.

3. The semiconductor device according to claim 2, wherein the distance L1 is greater than or equal to a distance L2 between the edges of the first drain-gate wiring layer and the active region for the first load transistor.

4. The semiconductor device according to claim 1, wherein the first drain-gate wiring layer has the smallest line width among wirings of the memory cell.

5. The semiconductor device according to claim 2, wherein the first drain-gate wiring layer has the smallest line width among wirings of the memory cell.

6. The semiconductor device according to claim 1, wherein the first gate-gate electrode layer and the first drain-gate wiring layer are formed in a first conductive layer of the semiconductor device.

7. The semiconductor device according to claim 2, wherein the first gate-gate electrode layer, the second gate-gate electrode layer, the first drain-gate wiring layer and the contact pad layer are formed in a first conductive layer of the semiconductor device.

8. The semiconductor device according to claim 1, further comprising:

a first drain-drain wiring layer that forms a part of a connection structure that electrically connects a drain of the first load transistor and a drain of the first driver transistor;

a second drain-drain wiring layer that forms a part of a connection structure that electrically connects a drain of the second load transistor and a drain of the second driver transistor;

a second gate-gate electrode layer including a gate electrode of the second load transistor and a gate electrode of the second driver transistor; and a second drain-gate wiring layer that forms a part of a connection structure that electrically connects the second gate-gate electrode layer and the first drain-drain wiring layer, wherein the first drain-gate wiring layer forms a part of a connection structure that electrically connects the first gate-gate electrode layer and the second drain-drain wiring layer.

9. The semiconductor device according to claim 8, wherein the first gate-gate electrode layer, the first drain-gate wiring layer, and the second gate-gate electrode layer are formed in a first conductive layer of the semiconductor device, the first drain-drain wiring layer, the second drain-drain wiring layer and the second drain-gate wiring layer are formed in a second conductive layer of the semiconductor device above the first conductive layer.

10. The semiconductor device according to claim 2, further comprising:

a first drain-drain wiring layer that forms a part of a connection structure that electrically connects a drain of the first load transistor and a drain of the first driver transistor;

a second drain-drain wiring layer that forms a part of a connection structure that electrically connects a drain of the second load transistor and a drain of the second driver transistor;

a second drain-gate wiring layer that forms a part of a connection structure that electrically connects the second gate-gate electrode layer and the first drain-drain wiring layer, wherein the first drain-gate wiring layer forms a part of a connection structure that electrically connects the first gate-gate electrode layer and the second drain-drain wiring layer.

11. The semiconductor device according to claim 10, wherein the first gate-gate electrode layer, the first drain-gate wiring layer, the second gate-gate electrode layer and the contact pad layer are formed in a first conductive layer of the semiconductor device, the first drain-drain wiring layer, the second drain-drain wiring layer and the second drain-gate wiring layer are formed in a second conductive layer of the semiconductor device above the first conductive layer.

12. A memory system comprising the semiconductor device according to claim 1.

13. A memory system comprising the semiconductor device according to claim 2.

14. An electronic apparatus comprising the semiconductor device according to claim 1.

15. An electronic apparatus comprising the semiconductor device according to claim 2.

* * * * *